United States Patent
Kimura et al.

(10) Patent No.: US 9,650,191 B2
(45) Date of Patent: May 16, 2017

(54) VAPOR-DEPOSITED FILM HAVING BARRIER PERFORMANCE

(75) Inventors: Shigeto Kimura, Ibaraki (JP); Tooru Hachisuka, Ibaraki (JP); Koji Yamauchi, Ibaraki (JP); Shigenobu Yoshida, Ibaraki (JP)

(73) Assignee: MITSUBISHI PLASTICS, INC., Tokyo (JP)

( * ) Notice: Subject to any disclaimer, the term of this patent is extended or adjusted under 35 U.S.C. 154(b) by 756 days.

(21) Appl. No.: 14/008,321

(22) PCT Filed: Mar. 29, 2012

(86) PCT No.: PCT/JP2012/058438
§ 371 (c)(1),
(2), (4) Date: Sep. 27, 2013

(87) PCT Pub. No.: WO2012/133687
PCT Pub. Date: Oct. 4, 2012

(65) Prior Publication Data
US 2014/0030510 A1    Jan. 30, 2014

(30) Foreign Application Priority Data
Mar. 31, 2011    (JP) ................ 2011-081278

(51) Int. Cl.
*B65D 65/42*    (2006.01)
*B05D 1/00*     (2006.01)
(Continued)

(52) U.S. Cl.
CPC ............. *B65D 65/42* (2013.01); *B05D 1/00* (2013.01); *C23C 14/022* (2013.01); *C23C 14/10* (2013.01);
(Continued)

(58) Field of Classification Search
None
See application file for complete search history.

(56) References Cited

U.S. PATENT DOCUMENTS

| 5,100,720 A | 3/1992 | Sawada et al. |
| 6,599,569 B1 * | 7/2003 | Humele ............ B29B 17/0026 427/231 |

FOREIGN PATENT DOCUMENTS

| JP | 2-34328 | 2/1990 |
| JP | 2-299826 | 12/1990 |

(Continued)

OTHER PUBLICATIONS

Combined Taiwanese Office Action and Search Report issued Oct. 19, 2015 in Patent Application No. 101111304 (with English Translation of Category of Cited Documents).

*Primary Examiner* — Alexandre Ferre
(74) *Attorney, Agent, or Firm* — Oblon, McClelland, Maier & Neustadt, L.L.P.

(57) ABSTRACT

Such a vapor-deposited barrier film is provided that has a vapor-deposited layer having uniform film quality, a high film density and high barrier performance in the initial stage. The vapor-deposited barrier film contains a substrate having on at least one surface thereof at least one layer of a vapor-deposited layer (a). The vapor-deposited layer (a) contains a metal oxide, has a thickness of from 10 to 500 nm, and has an average value of an elemental ratio of oxygen (O) and the metal (oxygen (O)/metal) of 1.20 or more and 1.90 or less and a difference between the maximum value and the minimum value of the (oxygen (O)/metal) of 0.35 or less on analysis of the vapor-deposited layer in the depth direction thereof by an X-ray photoelectron spectroscopy (ESCA) method.

19 Claims, 3 Drawing Sheets

(51) Int. Cl.
*C23C 14/10* (2006.01)
*C23C 14/56* (2006.01)
*C23C 14/58* (2006.01)
*C23C 14/02* (2006.01)

(52) U.S. Cl.
CPC .......... *C23C 14/562* (2013.01); *C23C 14/584* (2013.01); *Y10T 428/265* (2015.01)

(56) References Cited

FOREIGN PATENT DOCUMENTS

| | | |
|---|---|---|
| JP | 6-128725 | 5/1994 |
| JP | 8-300549 | 11/1996 |
| JP | 2008-230098 | 10/2008 |
| JP | 2009-179837 | 8/2009 |
| JP | 2011-256419 | 12/2011 |
| WO | WO 2010/093041 A1 | 8/2010 |
| WO | WO 2012/046767 A1 | 4/2012 |

* cited by examiner

VAPOR-DEPOSITED FILM HAVING BARRIER PERFORMANCE

CROSS REFERENCE TO RELATED APPLICATIONS

The present application is a 35 U.S.C. §371 national stage patent application of International patent application PCT/JP2012/058438, filed on Mar. 29, 2012, published as WO/2012/133687 on Oct. 4, 2012, the text of which is incorporated by reference, and claims the benefit of the filing date of Japanese application no. 2011-081278, filed on Mar. 31, 2011, the text of which is also incorporated by reference.

TECHNICAL FIELD

The present invention relates to a vapor-deposited barrier film, and more specifically, relates to a vapor-deposited barrier film that contains a vapor-deposited layer having excellent barrier performance and uniform film quality.

BACKGROUND ART

A vapor-deposited barrier film is used as a packaging material for foods, medical drugs and the like for preventing influence of oxygen, water vapor and the like as factors altering quality of contents, and as a packaging material for an electronic device and the like for preventing performance degradation of a device formed in a liquid crystal display panel, an EL display panel or the like due to contact with oxygen and water vapor. In recent years, a vapor-deposited barrier film is used in some cases instead of glass in a solar cell or the like for imparting flexibility and impact resistance to portions where glass has been used.

The vapor-deposited barrier film generally contains a substrate, such as a plastic film, and a barrier layer formed on one surface or both surfaces thereof. The vapor-deposited barrier film is produced in various methods, such as a chemical vapor deposition (CVD) method and a physical vapor deposition (PVD) method, and in any method used, the vapor-deposited barrier film thus obtained only has an oxygen transmission rate (OTR) of approximately 2 cc/($m^2 \cdot$day) and a water vapor transmission rate (WVTR) of approximately 2 g/($m^2 \cdot$day), which are still insufficient for purposes that require higher barrier performance.

CITATION LIST

Patent References

Patent Reference 1: JP-A-8-300549
Patent Reference 2: Japanese Patent No. 2,674,827

SUMMARY OF INVENTION

Technical Problem

In vapor deposition by a roll-to-roll method, a vapor-deposited layer is partially oxidized by gas that flows into the vapor deposition chamber from the unwinding and rewinding chamber, and thereby the vapor-deposited layer obtained has unstable barrier performance. Patent reference 1 and patent reference 2 apply treatments to the film for stabilizing the barrier performance, but the film receives a load, which may cause such problems as shrinkage of the film, breakage of the vapor-deposited layer, and delamination between the substrate and the vapor-deposited layer. Furthermore, the process step for applying the treatment is added, which is disadvantageous in cost, as compared to the film produced by performing only vapor deposition.

A problem to be solved by the invention is to provide a vapor-deposited high barrier film that has a vapor-deposited layer having uniform film quality, and a high film density and high barrier performance, even by a roll-to-roll vapor deposition method.

Solution to Problem

The present invention relates to:

(1) a vapor-deposited barrier film containing a substrate having on at least one surface thereof at least one layer of a vapor-deposited layer (a):

the vapor-deposited layer (a) containing a metal oxide, having a thickness of from 10 to 500 nm, and having an average value of an elemental ratio of oxygen (O) and the metal (oxygen (O)/metal) of 1.20 or more and 1.90 or less and a difference between a maximum value and a minimum value of the (oxygen (O)/metal) of 0.35 or less on analysis of the vapor-deposited layer in a depth direction thereof by an X-ray photoelectron spectroscopy (ESCA) method;

(2) the vapor-deposited barrier film according to the item (1), wherein the metal is silicon (Si);

(3) the vapor-deposited barrier film according to the item (1) or (2), wherein the vapor-deposited layer (a) is a vapor-deposited layer that is formed by a physical vapor deposition method;

(4) the vapor-deposited barrier film according to any one of the items (1) to (3), which has a multilayer vapor-deposited layer that contains the vapor-deposited layer (a);

(5) the vapor-deposited barrier film according to the item (4), wherein the multilayer vapor-deposited layer contains a vapor-deposited layer that is formed by a physical vapor deposition method and a vapor-deposited layer that is formed by a chemical vapor deposition method;

(6) the vapor-deposited barrier film according to the item (5), wherein the vapor-deposited layer that is formed by a physical vapor deposition method is a vapor-deposited layer that contains a metal oxide, has a thickness of from 10 to 500 nm, and has an average value of an elemental ratio of oxygen (O) and the metal (oxygen (O)/metal) of 1.20 or more and 1.90 or less and a difference between a maximum value and a minimum value of the (oxygen (O)/metal) of 0.35 or less on analysis of the vapor-deposited layer in a depth direction thereof by an X-ray photoelectron spectroscopy (ESCA) method;

(7) the vapor-deposited barrier film according to any one of the items (1) to (6), wherein the vapor-deposited layer (a) has an average value of an elemental ratio of oxygen (O) and the metal (oxygen (O)/metal) of 1.20 or more and 1.90 or less and a difference between a maximum value and a minimum value of the (oxygen (O)/metal) of 0.35 or less on analysis of the vapor-deposited layer (a) in a depth direction thereof by the same X-ray photoelectron spectroscopy (ESCA) method at each of nine positions that divide into 10 portions at regular intervals a width of the vapor-deposited barrier film except for portions of 3% in width from both width ends of the film;

(8) the vapor-deposited barrier film according to any one of the items (1) to (7), wherein the substrate is a plastic film;

(9) a method for producing the vapor-deposited barrier film according to any one of the items (1) to (8), containing forming the vapor-deposited layer (a) with a roll-to-roll vapor deposition apparatus containing at least a film unwinding and rewinding chamber and a vapor deposition chamber at a ratio of a pressure in the unwinding and rewinding chamber and a pressure in the vapor deposition chamber ((pressure in unwinding and rewinding chamber)/(pressure in vapor deposition chamber)) of 50 or less;

(10) the method for producing the vapor-deposited barrier film according to the item (9), wherein the ratio ((pressure in unwinding and rewinding chamber)/(pressure in vapor deposition chamber)) is 5 or less;

(11) the method for producing the vapor-deposited barrier film according to the item (9) or (10), wherein the pressure in the vapor deposition chamber is $2.5 \times 10^{-2}$ Pa or less;

(12) the method for producing the vapor-deposited barrier film according to any one of the items (9) to (11), wherein the vapor deposition apparatus further contains an evacuation chamber between the film unwinding and rewinding chamber and the vapor deposition chamber; and

(13) the method for producing the vapor-deposited barrier film according to any one of the items (9) to (12), wherein oxygen is introduced to the vapor deposition chamber on forming the vapor-deposited layer (a).

Advantageous Effects of Invention

According to the present invention, such a vapor-deposited high barrier film is obtained that has a vapor-deposited layer having uniform film quality, and a high film density and high barrier performance throughout from the substrate side to the surface side of the vapor-deposited layer.

Figure 1:
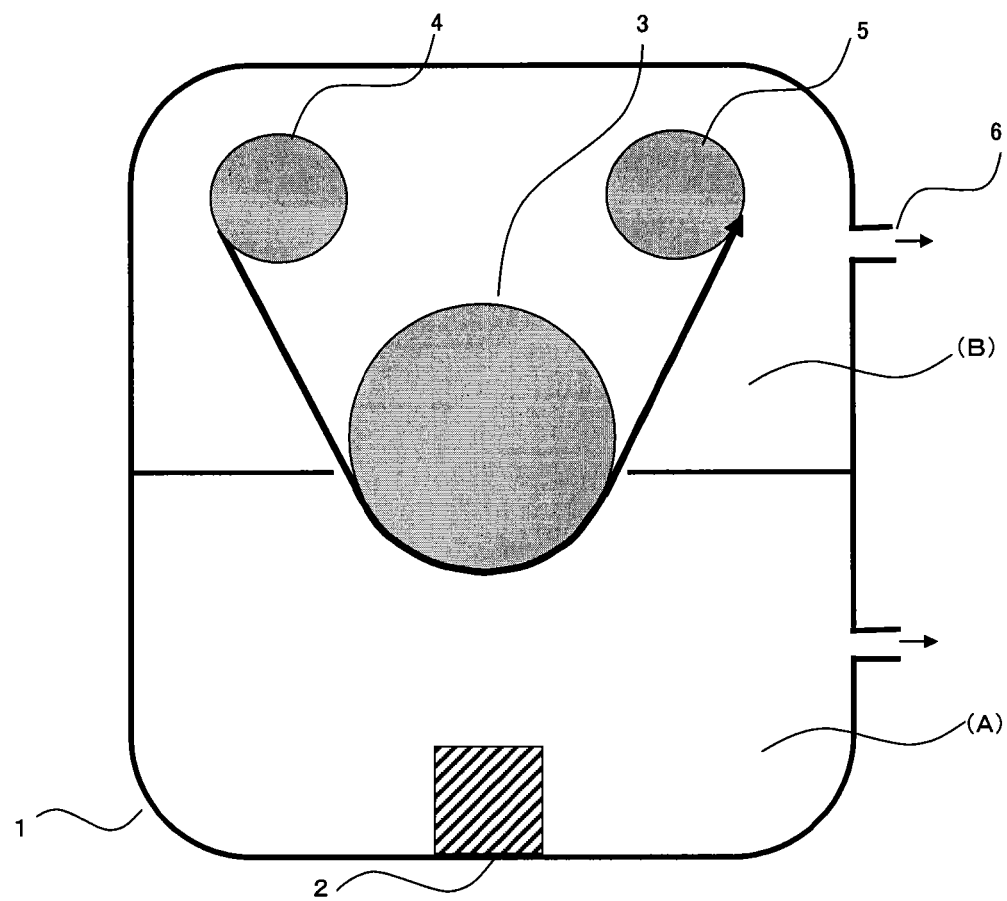
FIG. 1

The figure is a schematic illustration of an example of a vapor deposition apparatus for producing the vapor-deposited barrier film of the present invention.

FIG. 2

The figure is a schematic illustration of an example of a vapor deposition apparatus for producing the vapor-deposited barrier film of the present invention.

FIG. 3

The figure is a schematic illustration of a chart showing results of analysis of the vapor-deposited layer in the depth direction thereof by an X-ray photoelectron spectroscopy (ESCA) method.

DESCRIPTION OF EMBODIMENTS

The present invention will be described in detail below.
Vapor-deposited Barrier Film The vapor-deposited barrier film of the present invention is a vapor-deposited barrier film that contains a substrate having on at least one surface thereof at least one layer of the following vapor-deposited layer (a).

The vapor deposited layer (a) is a vapor-deposited layer that contains a metal oxide, has a thickness of from 10 to 500 nm, and has an average value of an elemental ratio of oxygen (O) and the metal (oxygen (O)/metal) of 1.20 or more and 1.90 or less and a difference between the maximum value and the minimum value of the (oxygen (O)/metal) of 0.35 or less on analysis of the vapor-deposited layer in the depth direction thereof by an X-ray photoelectron spectroscopy (ESCA) method.

Thus, when the average value of the elemental ratio of oxygen (O) and the metal (oxygen (O)/metal) is 1.20 or more and 1.90 or less, and the difference between the maximum value and the minimum value of the (oxygen (O)/metal) is 0.35 or less, such a vapor-deposited layer may be obtained that is dense, has high barrier performance, and is stable, throughout from the substrate side to the surface side of the vapor-deposited layer.

In the present invention, the elemental ratio of oxygen (O) and the metal (oxygen (O)/metal) may be referred to as an oxidation number in some cases.
Substrate The vapor-deposited barrier film of the present invention contains a substrate having on at least one surface thereof a vapor-deposited layer, and the substrate preferably is a plastic film, and particularly preferably is formed of a transparent thermoplastic polymer film. The raw material used therefor may be any resin that can be used in an ordinary packaging material without particular limitation. Specific examples thereof include a polyolefin, such as a homopolymer or a copolymer of ethylene, propylene, butene and the like; an amorphous polyolefin, such as a cyclic polyolefin; a polyester, such as polyethylene terephthalate and polyethylene 2,6-naphthalate; a polyamide, such as nylon 6, nylon 66, nylon 12 and copolymer nylon; polyvinyl alcohol, an ethylene-vinyl acetate copolymer partial hydrolysate (EVOH), a polyimide, a polyetherimide, a polysulfone, a polyethersulfone, a polyether ether ketone, a polycarbonate, a polyvinyl butyral, a polyarylate, a fluorine resin, an acrylate resin and a biodegradable resin. Among these, a polyester, a polyamide, a polyolefin and a biodegradable resin are preferred from the standpoint of the film strength, the cost and the like. Among these, a polyester, such as polyethylene terephthalate (PET) and polyethylene naphthalate (PEN), is particularly preferred.

The plastic film may contain known additives, such as an antistatic agent, a light shielding agent, an ultraviolet ray absorbent, a plasticizer, a lubricant, a filler, a colorant, a stabilizer, a lubricating agent, a crosslinking agent, an antiblocking agent and an antioxidant.

The plastic film is formed by molding the aforementioned raw material, and the film may be unstretched or stretched on using as the substrate. The plastic film may be laminated with another plastic substrate. The plastic film may be produced by a known method, and for example, a raw material resin is melted and extruded through a circular die or a T-die with an extruder, and then quenched, thereby producing an unstretched film, which is substantially amorphous and unoriented. The unstretched film is then stretched in the machine direction (longitudinal direction) of the film or in the machine direction and the direction perpendicular to the machine direction (transverse direction) of the film by a known method, such as uniaxial stretching, tenter sequential biaxial stretching, tenter simultaneous biaxial stretching, and tubular simultaneous biaxial stretching, thereby producing a film having been stretched uniaxially or biaxially.

The thickness of the substrate may be generally selected from a range of from 5 to 500 μm, and preferably from 10 to 200 μm, depending on the application thereof in consideration of the mechanical strength, the flexibility, the transparency and the like as the substrate, and a sheet material having a large thickness is also included. The width and length of the film are not particularly limited, and may be appropriately selected depending on the application thereof.
Vapor-Deposited Layer The vapor-deposited layer (a) formed on the substrate has a thickness of from 10 to 500 nm, is formed of a metal oxide, and has an average value of an elemental ratio of oxygen (O) and the metal (oxygen (O)/metal) of 1.20 or more and 1.90 or less and a difference between the maximum value and the minimum value of the (oxygen (O)/metal) of 0.35 or less on analysis of the vapor-deposited layer in the depth direction thereof by an X-ray photoelectron spectroscopy (ESCA) method described later.

When the (oxygen (O)/metal) satisfies the aforementioned conditions, such a vapor-deposited layer may be obtained that is uniform and dense, has high barrier performance, and is stable, throughout from the substrate side to the surface side of the vapor-deposited layer.

The average value of the (oxygen (O)/metal) is preferably 1.20 or more and 1.70 or less, and more preferably 1.20 or more and 1.45 or less, from the standpoint of the barrier performance. The difference between the maximum value and the minimum value of the (oxygen (O)/metal) is more preferably 0.2 or less, further preferably 0.1 or less, and particularly preferably as close as to 0, for suppressing the time-lapse change in barrier performance.

The (oxygen (O)/metal) is a value that is obtained by analyzing the vapor-deposited barrier film at the central position in the width direction thereof by ESCA. On analysis of the vapor-deposited layer (a) in the depth direction thereof by the same X-ray photoelectron spectroscopy (ESCA) method at nine positions that divide into 10 portions at regular intervals the width of the vapor-deposited barrier film except for portions of 3% in width (i.e., a 3% length with respect to the length in the width direction of the film) from both width ends of the film, it is preferred that the average value of the (oxygen (O)/metal) is 1.20 or more and 1.90 or less, and the difference between the maximum value and the minimum value of the (oxygen (O)/metal) is 0.35 or less, at each of the positions, and thereby the vapor-deposited layer (a) is uniform and dense in the width direction of the vapor-deposited barrier film, and thus becomes such a vapor-deposited layer that has high barrier performance and is stable. It is also preferred that the average value of the (oxygen (O)/metal) is 1.20 or more and 1.90 or less and is from 0.8 to 1.2 times, and more preferably from 0.9 to 1.1 times, the average value of the (oxygen (O)/metal) at the central position, and the difference between the maximum value and the minimum value of the (oxygen (O)/metal) is 0.35 or less, at each of the positions, and thereby the aforementioned advantages may be remarkable.

The thickness of the vapor-deposited layer (a) is preferably from 10 to 100 nm, and more preferably from 10 to 50 nm.

Examples of the metal include silicon, aluminum, magnesium, zinc, tin, nickel and titanium, and silicon (Si) is particularly preferred.

The vapor-deposited layer (a) may further contain other elements, such as nitrogen and carbon, in such a range that does not deviate from the concept of the present invention.

The vapor-deposited layer (a) may be formed by a physical vapor deposition (PVD) method or a chemical vapor deposition (CVD) method while the details of the formation method are described later. Examples of the physical vapor deposition method include a vacuum vapor deposition method, an ion plating method and a sputtering method, and examples of the chemical vapor deposition method include plasma CVD utilizing plasma, thermal CVD, photo CVD, MOCVD and a catalytic chemical vapor deposition (Cat-CVD) method, in which a raw material gas is subjected to catalytic decomposition with a heated catalyst. The vapor-deposited layer (a) is preferably formed by a physical vapor deposition method, and particularly a vacuum vapor deposition method, thereby providing a uniform thin film having high gas barrier performance.

The vapor-deposited barrier film of the present invention may further contain another vapor-deposited layer in addition to the vapor-deposited layer (a).

The vapor-deposited barrier film of the present invention preferably has such an embodiment that a multilayer vapor-deposited layer that contains the vapor-deposited layer (a) is formed on the substrate, and thereby higher gas barrier performance may be exhibited. Examples of the multilayer vapor-deposited layer include such a multilayer vapor-deposited layer that contains a vapor-deposited layer formed by a physical vapor deposition method (which may be hereinafter referred to as a PVD layer) and a vapor-deposited layer formed by a chemical vapor deposition method (which may be hereinafter referred to as a CVD layer), in which at least one layer of the PVD layer is the vapor-deposited layer (a). The vapor-deposited layers may have the same composition or different compositions. In particular, a structure containing a PVD layer and a CVD layer that are formed alternately, for example, a structure containing a PVD layer, a CVD layer and a PVD layer in this order, in which at least one layer of the PVD layers is the vapor-deposited layer (a), is preferred. By forming a CVD layer on a PVD layer, defects and the like formed in the PVD layer are filled, and thus the gas barrier performance and the interlayer adhesion may be enhanced.

The formation method of the PVD layer is preferably a vacuum vapor deposition method since a uniform thin film having high gas barrier performance may be obtained.

The thickness of the PVD layer is generally from 0.1 to 500 nm, and is preferably from 5 to 100 nm, more preferably from 10 to 100 nm, and particularly preferably from 10 to 50 nm, from the standpoint of the gas barrier performance and the productivity of the film.

Examples of the substance constituting the PVD layer include silicon, aluminum, magnesium, zinc, tin, nickel, titanium and diamond-like carbon, an oxide, a carbonate and a nitrate thereof, and mixtures thereof. An inorganic oxide, such as aluminum oxide, silicon oxide, silicon oxynitride and silicon oxynitride carbide, an inorganic nitride, such as silicon nitride, and diamond-like carbon are preferred since no electric current leakage may occur on applying the vapor-deposited barrier film to a solar cell. In particular, aluminum oxide, silicon oxide, silicon oxynitride, silicon oxynitride carbide and silicon nitride are preferred since high gas barrier performance may be stably maintained. These substances may be used solely or as a combination of two or more kinds thereof. The PVD layer may contain other elements in such a range that does not deviate from the concept of the present invention.

The lower limit of the thickness of the CVD layer is preferably 0.1 nm, and more preferably 0.5 nm, as the minimum thickness for exhibiting the filling effect on the PVD layer. When the thickness is in the range, the adhesion property, the gas barrier performance and the like may be favorably enhanced. In view of these points, the thickness of the CVD layer is preferably 0.1 nm or more and less than 20 nm, more preferably 0.1 nm or more and less than 10 nm, further preferably 0.1 nm and less than 5 nm, and particularly preferably 0.1 nm or more and less than 3 nm.

The surface roughness of the PVD layer (which is measured by AFM) is preferably approximately 5 nm or less for exhibiting the barrier performance since the vapor-deposited particles may be accumulated densely. In this case, when the thickness of the CVD layer is less than 20 nm, the vapor-deposited particles fill the open gaps present in the depressions among the vapor-deposited particles but cover only thinly the bumps of the vapor-deposited particles (or partially expose them), and thereby the adhesion between the PVD layers may be further enhanced. When the thickness of the CVD layer is 0.1 nm or more, the filling effect on the open gaps of the lower PVD layer may be exhibited, and simultaneously the surface thereof may be smoothed. Accordingly, on vapor-depositing the upper PVD layer, the vapor-deposited particles undergo good surface diffusion and thus accumulate more densely, and thereby the barrier performance may be further enhanced.

The thickness of the CVD layer may be measured by the method described later.

In the present invention, the CVD layer preferably has a carbon content, which is measured by an X-ray photoelectron spectroscopy (ESCA) method, of less than 20 at %, more preferably less than 10 at %, and particularly preferably less than 5 at %. When the carbon content is such a value, the CVD layer may have large surface energy and thus does not impair the close adhesion of the vapor-deposited layers. Accordingly, the barrier film may be enhanced in folding resistance and delamination resistance.

The carbon content of the CVD layer is preferably 0.5 at or more, more preferably 1 at or more, and particularly preferably 2 at % or more. When the CVD layer contains carbon slightly, the stress may be relaxed efficiently, and the vapor-deposited barrier film may be reduced in curling. This effect may be conspicuous when the CVD layer is an intermediate layer of the multilayer vapor-deposited layer.

In view of these points, the carbon content of the CVD layer is preferably 0.5 at or more and less than 20 at %, more preferably 1 at or more and less than 10 at %, and particularly preferably 2 at % or more and less than 5 at %. The unit "at %" herein means percentage by atom (atomic percent).

The method for making the carbon content of the CVD layer within the range is not particularly limited, and examples thereof include a method of selecting the raw materials in CVD to achieve the carbon content, a method of controlling with the flow rates and the ratios of the raw materials and the reactive gas (such as oxygen and nitrogen), and a method of controlling with the pressure and the applied voltage on forming the film.

The specific measurement method of the carbon content by an X-ray photoelectron spectroscopy (ESCA) method will be described later.

Examples of the CVD layer include a layer containing at least one selected from a metal, a metal oxide, a metal nitride and diamond-like carbon, as described above. A metal, such as silicon and titanium, diamond-like carbon and the like are preferred from the standpoint of the gas barrier performance and the adhesion property, and as the metal oxide or the metal nitride, an oxide and a nitride of these metals and mixtures thereof are preferred from the standpoint of the gas barrier performance and the adhesion property. In the present invention, in view of these points, the CVD layer is further preferably formed of at least one selected from silicon oxide, silicon nitride, silicon oxynitride, titanium oxide and diamond-like carbon.

The formation method of the CVD layer is preferably plasma CVD for achieving high productivity by increasing the film forming speed and for preventing the substrate from suffering thermal damages, and Cat-CVD is preferred since it is excellent in mass productivity and quality of the film thus formed.

Examples of the CVD layer formed by a plasma CVD method include a layer formed of at least one selected from a metal, a metal oxide, a metal nitride and the like, which are obtained by plasma decomposition of an organic compound.

The raw material for forming the CVD layer, such as a silicon oxide film, may be any compound, such as a silicon compound, which may be in the form of gas, liquid or solid under a ordinary temperature and ordinary pressure. The raw material in the form of gas may be introduced directly to the discharge chamber, and that in the form of liquid or solid may be used after vaporization by heating, bubbling, depressurization, ultrasonic wave application, and the like. The raw material may be used after diluting with a solvent, and examples of the solvent used include an organic solvent, such as methanol, ethanol and n-hexane, and mixed solvents thereof.

Examples of the silicon compound include silane, tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyldimethoxysilane, methyltriethoxysilane, ethyltrimethoxysilane, phenyltriethoxysilane, (3,3,3-trifluoropropyl)trimethoxysilane, hexamethyldisiloxane, bis(dimethylamino)dimethylsilane, bis(dimethylamino)methylvinylsilane, bis(ethylamino)dimethylsilane, N,O-bis(trimethylsilyl)acetamide, bis(trimethylsilyl)carbodiimide, diethylaminotrimethylsilane, dimethylaminodimethylsilane, hexamethyldisilazane, hexamethylcyclotrisilazane, heptamethyldisilazane, nonamethyltrisilazane, octamethylcyclotetrasilazane, tetrakisdimethylaminosilane, tetraisocyanatosilane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadiyne, di-t-butylsilane, 1,3-disilabutane, bis(trimethylsilyl)methane, cyclopentadienyltrimethylsilane, phenyldimethylsilane, phenyltrimethylsilane, propargyltrimethylsilane, tetramethylsilane, trimethylsilylacetylene, 1-(trimethylsilyl)-1-propyne, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethyldisiloxane, hexamethylcyclotetrasiloxane and M-Silicate 51.

Examples of the titanium compound include a titanium alkoxide, such as titanium tetrabutoxide, tetra-n-butyl titanate, butyl titanate dimer, tetra(2-ethylhexyl)titanate, and tetramethyl titanate, and a titanium chelate compound, such as titanium lactate, titanium acetylacetonate, titanium tetraacetylacetonate, polytitanium acetylacetonate, titanium octylene glycolate, titanium ethyl acetoacetate and titanium triethanol aminate.

Production of Vapor-Deposited Barrier Film

Figure 2:
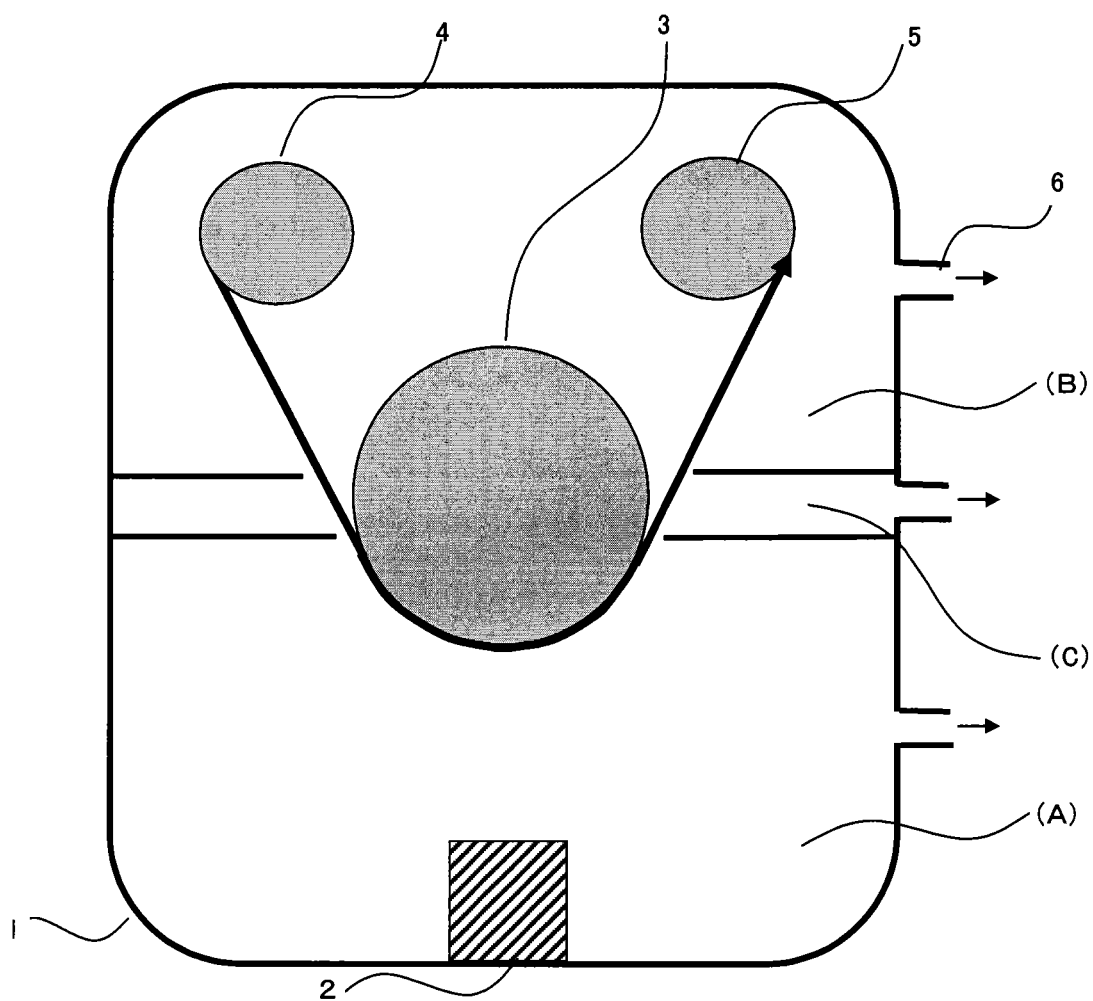
Figure 3:
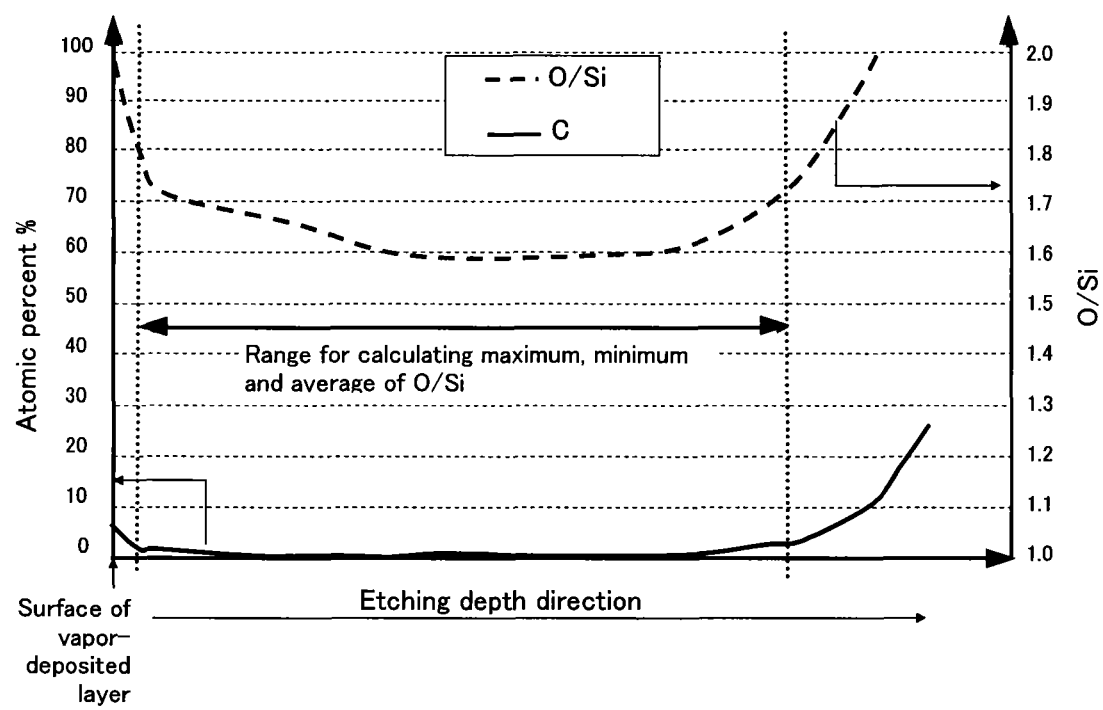

FIGS. 1 and 2 each is a schematic illustration of an example of a vapor deposition apparatus capable of producing the vapor-deposited barrier film of the present invention.

In FIG. 1, a vapor deposition apparatus for producing the vapor-deposited barrier film of the present invention has a vapor deposition source 2 to vaporize the vapor material such as silicon oxide, a roll 3, an unwinding roll 4, a rewinding roll 5, a vapor deposition chamber (A) and an unwinding and rewinding chamber (B). In the vapor deposition apparatus 1, the vapor-deposited film is continuously produced by a roll-to-roll method in such a manner that a substrate is unwound from the unwinding roll 4, on which a silicon oxide or the like is then vacuum vapor-deposited in the vapor deposition chamber (A), and the substrate is rewound by the rewinding roll 5.

The pressure in the vapor deposition chamber (A) is generally controlled lower than the pressure in the vapor deposition chamber (B). The pressure may be controlled, for example, by evacuating the chambers continuously with a vacuum pump, whereby the gas, such as oxygen, flowing into the vapor deposition chamber (A) is reduced to prevent the pressure in the vapor deposition chamber (A) from being changed. As shown in FIG. 2, furthermore, an evacuation chamber (C) (which may be referred to as a buffer chamber) may be provided for evacuation between the vapor deposition chamber (A) and the unwinding and rewinding chamber (B). The evacuation chamber (C) may further reduce the gas flowing into the vapor deposition chamber (A), thereby preventing the pressure in the vapor deposition chamber (A) from being changed.

The pressure in the vapor deposition chamber (A) is preferably $2.5 \times 10^{-2}$ Pa or less. The ratio ((pressure in unwinding and rewinding chamber (B))/(pressure in vapor deposition chamber (A))) is preferably 50 or less, more preferably 20 or less, and further preferably 5 or less, and the difference in pressure between the chambers is preferably as small as possible for reducing the gas flowing into the vapor deposition chamber (A), thereby preventing the pressure in the vapor deposition chamber (A) from being changed. A gas, such as oxygen and a gas having low reactivity, may be introduced for controlling the pressure on forming the film.

Such a method may be employed that plural large evacuation equipments are provided for evacuating the whole apparatus including the unwinding and rewinding chamber (B) and the vapor deposition chamber (A) to the same pressure, but may be industrially impractical due to large equipments required.

By reducing the gas flowing into the vapor deposition chamber (A), as described above, the pressure on vapor deposition within the period of from the start of vapor deposition to the completion thereof may be uniformized, thereby forming a vapor-deposited layer (a) having an average value of an elemental ratio (oxygen (O)/metal) of 1.20 or more and 1.90 or less and a difference between the maximum value and the minimum value of the (oxygen (O)/metal) of 0.35 or less. When the vapor-deposited layer has the aforementioned particular oxidation number, the vapor-deposited layer may have uniform properties and stable barrier performance.

The average value of the (oxygen (O)/metal) is preferably 1.20 or more and 1.70 or less, and more preferably 1.20 or more and 1.45 or less, from the standpoint of barrier performance. The difference between the maximum value and the minimum value of the (oxygen (O)/metal) is more preferably 0.2 or less, further preferably 0.1 or less, and particularly preferably as close as to 0, for enhancing the uniformity of the vapor-deposited layer and for preventing the time-lapse change of the barrier performance thereof.

By reducing the gas flowing into the vapor deposition chamber (A), as described above, the pressure on vapor deposition within the period of from the start of vapor deposition to the completion thereof may be uniformized, and thereby the vapor-deposited layer (a) may have an average value of the (oxygen (O)/metal) of 1.20 or more and 1.90 or less and a difference between the maximum value and the minimum value of the (oxygen (O)/metal) of 0.35 or less on analysis of the vapor-deposited layer (a) in the depth direction thereof by the above-described X-ray photoelectron spectroscopy (ESCA) method at each of nine positions that divide into 10 portions at regular intervals the width of the vapor-deposited barrier film except for portions of 3% in width (i.e., a 3% length with respect to the length in the width direction of the film) from both width ends of the film.

The difference between the maximum value and the minimum value of the (oxygen (O)/metal) of the vapor-deposited layer (a) may be reduced, i.e., the vapor-deposited layer may be uniformized, by using plural vapor deposition sources. The plural vapor deposition sources are preferably disposed in the traveling direction of the substrate, and it is further effective that the distances to the substrate and the evaporation directions of the vapor deposition material from the vapor deposition sources are uniformized among the vapor deposition sources. Furthermore, the moving distance of the substrate on the roll from the start of vapor deposition to the completion thereof inside the vapor deposition chamber (A) may be shortened, or a shielding plate that limits the film forming area on the roll may be provided in the vapor chamber (A), whereby the film is formed in an area that is substantially directly above the vapor deposition source, and thus the difference between the maximum value and the minimum value of the (oxygen (O)/metal) of the vapor-deposited layer (a) may be reduced.

The formation methods of the vapor-deposited layer (a) may be employed solely or may be combined.

As having been described above, the vapor-deposited layer in the vapor-deposited barrier film of the present invention may be a monolayer but is preferably a multilayer vapor-deposited layer containing two or more layers including the vapor-deposited layer (a), and thereby higher gas barrier performance may be exhibited. Examples of the multilayer vapor-deposited layer include a multilayer vapor-deposited layer that contains a PVD layer and a CVD layer, in which at least one layer of the PVD layer is the vapor-deposited layer (a), as described above.

The PVD layer may be formed, for example, under reduced pressure preferably while conveying the substrate, for forming a dense vapor-deposited layer. The pressure on forming the PVD layer is preferably $1 \times 10^{-7}$ to 1 Pa, more preferably from $1 \times 10^{-6}$ to $1 \times 10^{-1}$ Pa, and further preferably from $1 \times 10^{-4}$ to $1 \times 10^{-2}$ Pa, from the standpoint of the vacuuming performance and the barrier performance. When the pressure is in the range, sufficient gas barrier performance may be obtained, and the PVD layer may have no crack or delamination and may be excellent in transparency.

In the present invention, the CVD layer is preferably formed at a conveying speed of the substrate of 100 m/min or more from the standpoint of enhancement of the productivity. The conveying speed of the substrate is more preferably 200 m/min or more. The upper limit thereof is not particularly determined, and is preferably 1,000 m/min or less from the standpoint of the stability on conveying the substrate. The CVD layer is preferably formed under reduced pressure for forming a dense vapor-deposited layer, and the pressure is preferably 10 Pa or less, more preferably in a range of from $1 \times 10^{-2}$ to 10 Pa, and further preferably from $1 \times 10^{-1}$ to 1 Pa. The CVD layer may be subjected to a crosslinking treatment through irradiation with an electron beam for enhancing the water resistance and the durability thereof.

The CVD layer may be formed in such a manner that the raw material compound is evaporated and introduced as a raw material gas to a vacuum chamber, and is formed into plasma with a low temperature plasma generator of direct current (DC) plasma, low frequency plasma, high frequency (RF) plasma, pulse wave plasma, three-electrode plasma, microwave plasma, downstream plasma, columnar plasma, plasma-assisted epitaxy, or the like. A high frequency (RF) plasma equipment is more preferred from the standpoint of the stability of plasma.

In the case where a multilayer vapor-deposited layer containing the vapor-deposited layer (a) is formed in the present invention, the vapor deposited layers are preferably formed continuously in vacuum from the standpoint of the gas barrier performance and the productivity. In the present invention, specifically, the layers are preferably formed continuously with the vacuum maintained but not formed in such a manner that every time after forming one vapor-deposited layer, the pressure in the vapor deposition chamber is returned to around the atmospheric pressure, and then the chamber is again vacuumed for performing the subsequent process. The vapor-deposited layers are preferably formed while conveying the film from the standpoint of the productivity.

Anchor Coating Layer

An anchor coating layer is preferably provided by applying an anchor coating agent between the substrate and the vapor-deposited layer for enhancing the adhesion between the substrate and the vapor-deposited layer. Examples of the anchor coating agent include a polyester resin, a urethane resin, an acrylic resin, a nitrocellulose resin, a silicone resin, a vinyl alcohol resin, a polyvinyl alcohol resin, an ethylene-vinyl alcohol resin, a modified vinyl resin, an isocyanate group-containing resin, a carbodiimide resin, an alkoxy group-containing resin, an epoxy resin, an oxazoline group-containing resin, a modified styrene resin, a modified silicone resin and a poly-p-xylylene resin, which may be used solely or as a combination of two or more kinds thereof from the standpoint of the productivity.

The anchor coating layer may contain a silane coupling agent, a titanium coupling agent, an alkyl titanate, an inorganic particle, an ultraviolet ray absorbent, a stabilizer, such as a weather resistant stabilizer, a lubricant, an antiblocking agent, an antioxidant, and the like, depending on necessity.

The thickness of the anchor coating layer provided on the substrate is generally from 0.1 to 5,000 nm, preferably from 1 to 2,000 nm, and more preferably from 1 to 1,000 nm. When the thickness is in the range, good lubricating property may be obtained, delamination of the anchor coating layer from the substrate due to internal stress in the anchor coating layer may substantially not occur, a uniform thickness may be maintained, and excellent adhesion between the layers may be obtained.

For enhancing the coating property and the adhesion property of the anchor coating agent on the substrate, the substrate may be subjected to an ordinary surface treatment, such as a chemical treatment and a discharge treatment, before applying the anchor coating agent.

Protective Layer, etc.

The vapor-deposited barrier film of the present invention may optionally have other layers, such as a protective layer, depending on necessity.

The protective layer is preferably provided as an uppermost layer. Examples of the resin for forming the protective layer include a solvent soluble resin and an aqueous resin, both of which may be used, and specific examples thereof include a polyester resin, a urethane resin, an acrylic resin, a polyvinyl alcohol resin, an ethylene-unsaturated carboxylic acid copolymer resin, an ethylene-vinyl alcohol resin, a modified vinyl resin, a nitrocellulose resin, a silicone resin, an isocyanate resin, an epoxy resin, an oxazoline group-containing resin, a modified styrene resin and a modified silicone resin, which may be used solely or as a combination of two or more kinds thereof. The resin for forming the protective layer is preferably an aqueous resin as described above from the standpoint of enhancement of the gas barrier performance of the vapor-deposited layer. Preferred examples of the aqueous resin include a polyvinyl alcohol resin, an ethylene-vinyl alcohol resin and an ethylene-unsaturated carboxylic acid copolymer resin. The protective layer may contain at least one kind of inorganic particles selected from silica sol, alumina sol, a particulate inorganic filler and a flaky inorganic filler for the sake of improving its barrier property, wearability, and slippage. The protective layer may be a layer formed of an inorganic particle-containing resin formed by polymerizing the raw material of the resin in the presence of the inorganic particles.

The thickness of the protective layer is preferably from 0.05 to 10 µm, and more preferably from 0.1 to 3 µm, from the standpoint of the printability and the processability. The method for forming the protective layer may be selected from known coating methods. Examples thereof include a coating method a reverse roll coater, a gravure coater, a rod coater, an air doctor coater, using spray or brush. The protective layer may be formed by dipping the vapor-deposited film in a resin solution for the protective layer. After coating, water may be evaporated by a known drying method, for example, heat drying, such as hot air drying at a temperature of approximately from 80 to 200° C. and heat roll drying, and an infrared ray drying. Consequently, the vapor-deposited barrier film may have a uniform protective layer.

The vapor-deposited barrier film of the present invention may be further laminated with an additional constitutional layer depending on necessity to form various laminated barrier films for various purposes.

In one typical embodiment, a laminated barrier film having a plastic film laminated on the vapor-deposited layer or the protective layer may be used for various purposes. The thickness of the plastic film may be generally selected from a range from 5 to 500 µm, and preferably from 10 to 200 µm, depending on the purpose in consideration of the mechanical strength, the flexibility, the transparency and the like. The width and length of the film are not particularly limited and may be selected depending on the purpose. For example, a heat-sealable plastic film may be laminated on the vapor-deposited layer or the protective layer for enabling heat sealing, and the film may be applied to various containers. Examples of the heat-sealable resin include known resins, such as a polyethylene resin, a polypropylene resin, an ethylene-vinyl acetate copolymer, an ionomer resin, an acrylic resin and a biodegradable resin.

In another embodiment of the laminated barrier film, a printed layer is provided on the vapor-deposited layer or the protective layer, and a heat-sealable layer is further laminated thereon. Examples of the printing ink for forming the printed layer include a printing ink containing an aqueous or solvent soluble resin. Examples of the resin used in the printing ink include an acrylic resin, a urethane resin, a polyester resin, a vinyl chloride resin, a vinyl acetate copolymer resin, and mixtures thereof. The printing ink may contain known additives, such as an antistatic agent, a light shielding agent, an ultraviolet ray absorbent, a plasticizer, a lubricant, a filler, a colorant, a stabilizer, a lubricating agent, a defoaming agent, a crosslinking agent, an antiblocking agent and an antioxidant.

Elemental Analysis by X-Ray Photoelectron Spectroscopy (ESCA) Method

In the present invention, the ratio (oxygen (O)/metal) is obtained based on measurement by an X-ray photoelectron spectroscopy (ESCA) method and is a value in a region where the content of carbon (C) in the vapor-deposited layer is 3% or less based on the total elements. This means such a measured value that is obtained in the region except for portions having an increased carbon content due to contamination or the like on the surface of the vapor-deposited layer caused by handling the vapor-deposited layer, and due to the substrate or the like on the ESCA measurement.

In the measurement of the O/Si elemental ratio by an X-ray photoelectron spectroscopy (ESCA) method, specifically, the binding energy is measured by an X-ray photoelectron spectroscopic equipment (such as K-Alpha, produced by Thermo Fisher Scientific, Inc.), and the elemental composition (at %) may be calculated by converting the peak areas corresponding to Si2p, C1s and O1s. The O/Si elemental ratio may be calculated from the elemental composition of Si and O. Silicon dioxide is measured with the same equipment to provide a relative coefficient with O/Si=2, with which the value of O/Si elemental ratio is calibrated, thereby providing the O/Si elemental ratio in the present invention. The average value, the maximum value and the minimum value of the (oxygen (O)/metal) may be obtained from the spectrum chart of the X-ray photoelectron spectroscopy (ESCA) method.

EXAMPLE

The present invention will be described more specifically with reference to examples below, but the present invention is not limited to the examples. The evaluation methods of films in the examples are as follows.

Moisture Transmission Rate (Water Vapor Transmission Rate)

The vapor-deposited barrier films after forming the vapor-deposited layer were evaluated for moisture transmission rate in the following manner.

Two sheets of the gas barrier laminate films each having a moisture permeation area of a square of 10.0 cm×10.0 cm were used, and a bag having been sealed on the four edges thereof containing approximately 20 g of anhydrous calcium chloride as a desiccant was produced therewith. After placing the bag in a constant temperature and humidity chamber at a temperature of 40° C. and a relative humidity of 90%, the moisture transmission rate on the first day (g/m$^2$·day) was calculated by the following expression. The mass was measured from 14th day, on which the moisture transmission rate became stable, to 30th day with an interval of 72 hours or more, and the moisture transmission (g/m$^2$·day) was calculated from the regression line of the elapsed time after the 14th day and the mass of the bag and was designated as the moisture transmission rate on the 14th day.

moisture transmission rate of first day (g/m$^2$·day)= (m/s·t)

m: mass increment (g) after one day from start of test
s: moisture permeation area (m$^2$)
t: one day Elemental Analysis by ESCA The vapor-deposited barrier film was measured in the depth direction of the vapor-deposited film at the central position in the width direction of the film with an X-ray photoelectron spectroscopic equipment (K-Alpha, produced by Thermo Fisher Scientific, Inc.). The binding energy was measured, and the elemental composition (at %) was calculated by converting the peak areas corresponding to Si2p, C1s and O1s. The measurement was performed under such condition that the X-ray gun had a spot size of 400 μm, a cathode HT of 12,000 V and a beam of 6 mA, and the ion gun was in an Ar atmosphere and had ion energy of 1,000 V, electron energy of 120 V and electron emission of 10 mA.

The O/Si elemental ratio was calculated from the elemental composition of Si and O. Silicon dioxide was measured with the same equipment to provide a relative coefficient with O/Si=2, with which the value of O/Si elemental ratio was calibrated.

Thickness of Vapor-Deposited Layer

The thickness of the vapor-deposited layer was measured with a fluorescent X-ray. This method utilizes the phenomenon that an atom emits fluorescent X-ray that is specific to the atom on being irradiated with an X-ray, by which the number (amount) of atoms can be found by measuring the intensity of the fluorescent X-ray emitted. Specifically, two thin films each having a known but different thickness were formed on a film and measured for the intensity of the fluorescent X-ray thus emitted, and a calibration curve was provided from the information thus measured. A specimen was then measured for the intensity of the fluorescent X-ray, and the thickness thereof was obtained based on the calibration curve.

Example 1

A biaxially stretched polyethylene terephthalate film having a thickness of 12 μm was used as a substrate, and a vapor-deposited film of SiO$_x$ was formed on the corona-treated surface thereof by evaporating SiO in vacuum of 2.0×10$^{-2}$ Pa by a heating method in a vacuum vapor deposition apparatus shown in FIG. 1 (pressure in the film unwinding and rewinding chamber: 6.3×10$^{-2}$ Pa). The resulting vapor-deposited barrier film was measured for the thickness with a fluorescent X-ray and analyzed in the depth direction by an X-ray photoelectron spectroscopy (ESCA) method. A urethane adhesive (a mixture of "AD 900" and "CATRT 85", both produced by Toyo-Morton, Ltd., at a ratio of 10/1.5) was applied and dried on the vapor-deposited layer of the resulting vapor-deposited barrier film to form an adhesive resin layer having a thickness of approximately 3 μm, and an unstretched polypropylene film having a thickness of 60 μm (Pylen Film CT P1146, produced by Toyobo Co., Ltd.) was laminated on the adhesive resin layer, thereby providing a laminated film. The resulting laminated film was evaluated for moisture transmission rate. The results are shown in Table 1.

Examples 2 to 5 and Comparative Example 1

Vapor-deposited barrier films were obtained in the same manner as in Example 1 except that the vapor deposition conditions by PVD were changed to those shown in Table 1. In Example 4, two PVD layers were formed. In Example 5, after forming a PVD layer, a CVD layer (SiONC (silicon oxynitride carbide) was formed with plasma in the same vapor deposition apparatus in vacuum of 0.4 Pa without returning the pressure to the atmospheric pressure, by introducing thereto HMDSN (hexamethyldisilazane), nitrogen and Ar gas at a molar ratio of 1/7/7 to form the plasma, and a PVD layer was further formed thereon. The resulting vapor-deposited barrier films were measured for the thickness with a fluorescent X-ray and analyzed in the depth direction by an X-ray photoelectron spectroscopy (ESCA) method. Laminated films were obtained with the resulting vapor-deposited barrier films in the same manner as in Example 1 and evaluated for moisture transmission rate. The results are shown in Table 1.

Comparative Example 2

A biaxially stretched polyethylene terephthalate film having a thickness of 12 μm was used as a substrate, and a vapor-deposited film of SiO$_x$ was formed on the corona-treated surface thereof by evaporating SiO in vacuum of 9.4×10$^{-3}$ Pa by a heating method and introducing oxygen gas to a vapor deposition chamber in a vacuum vapor deposition apparatus shown in FIG. 1 (pressure in the film unwinding and rewinding chamber: $5.8 \times 10^{-2}$ Pa). The resulting vapor-deposited barrier film was measured for the thickness with a fluorescent X-ray and analyzed in the depth direction by an X-ray photoelectron spectroscopy (ESCA) method. A laminated film was obtained with the resulting vapor-deposited barrier film in the same manner as in Example 1 and evaluated for moisture transmission rate. The results are shown in Table 1.

TABLE 1

| | | PVD conditions | | | Characteristics of PVD layer | | | | |
|---|---|---|---|---|---|---|---|---|---|
| | Substrate | Vapor deposition material | Pressure in vapor deposition chamber (Pa) | Pressure in unwinding and rewinding chamber (Pa) | Pressure ratio | | Average value of O/Si | Maximum value of O/Si | Minimum value of O/Si | Difference between maximum and minimum of O/Si |
| Example 1 | PET | SiO | $2.0 \times 10^{-2}$ | $6.3 \times 10^{-2}$ | 3.2 | first layer *1 | 1.24 | 1.37 | 1.18 | 0.19 |
| Example 2 | PET | SiO | $6.1 \times 10^{-3}$ | $3.0 \times 10^{-2}$ | 4.9 | first layer | 1.45 | 1.49 | 1.43 | 0.06 |
| Example 3 | PET | SiO | $1.9 \times 10^{-2}$ | $6.3 \times 10^{-2}$ | 3.3 | first layer | 1.59 | 1.64 | 1.55 | 0.09 |
| Example 4 | PET | SiO | $5.7 \times 10^{-3}$ | $2.2 \times 10^{-1}$ | 39 | first layer | 1.30 | 1.47 | 1.21 | 0.26 |
| | | | | | | second layer *2 | 1.35 | 1.57 | 1.25 | 0.32 |
| Example 5 | PET | SiO | $5.6 \times 10^{-3}$ | $2.0 \times 10^{-1}$ | 36 | first layer | 1.33 | 1.45 | 1.23 | 0.22 |
| | | | | | | second layer | 1.38 | 1.58 | 1.26 | 0.32 |
| Comparative Example 1 | PET | SiO | $1.7 \times 10^{-2}$ | $8.9 \times 10^{-1}$ | 52.4 | first layer | 1.43 | 1.69 | 1.30 | 0.39 |
| Comparative Example 2 | PET | SiO | $9.4 \times 10^{-3}$ | $5.8 \times 10^{-2}$ | 6.2 | first layer | 1.93 | 2.13 | 1.77 | 0.36 |

| | Total thickness of vapor-deposited layer (Å) | Constitution of laminated film | Moisture transmission rate (g/m² · day) | | |
|---|---|---|---|---|---|
| | | | 1st day of measurement | 14th day of measurement | Time-lapse change |
| Example 1 | 270 | PET•SiOx//CPP | 0.43 | 0.32 | 0.11 |
| Example 2 | 220 | PET•SiOx//CPP | 0.87 | 0.26 | 0.61 |
| Example 3 | 230 | PET•SiOx//CPP | 1.39 | 0.44 | 0.95 |
| Example 4 | 670 | PET•SiOx•SiOx//CPP | 0.16 | 0.12 | 0.04 |
| Example 5 | 640 | PET•SiOx•SiOCN•SiOx//CPP | 0.07 | 0.01 | 0.06 |
| Comparative Example 1 | 150 | PET•SiOx//CPP | 5.17 | 0.60 | 4.57 |
| Comparative Example 2 | 210 | PET•SiOx//CPP | 4.74 | 1.61 | 3.13 |

*1: first PVD layer from the substrate
*2: second PVD layer from the substrate

It is understood from Table 1 that Examples 1 to 5, in which the average value of O/Si of the vapor-deposited layer is in a range of from 1.20 to 1.90, and the difference between the maximum value and the minimum value of O/Si in the vapor-deposited layer is in a range of 0.35 or less, exhibit good barrier performance in the initial stage and less time-lapse change of the barrier performance, i.e., the difference between the moisture transmission rate of the first day of the measurement and the moisture transmission rate of the 14th day where the barrier performance becomes stable is 1.00 (g/m²·day) or less.

REFERENCE SIGN LIST

1: vapor deposition apparatus
2: vapor deposition source
3: roll
4: unwinding roll
5: rewinding roll
6: evacuation port
(A): vapor deposition chamber
(B): unwinding and rewinding chamber
(C): evacuation chamber

The invention claimed is:

1. A vapor-deposited barrier film comprising a substrate having on at least one surface thereof at least one layer of a vapor-deposited layer (a), wherein the vapor-deposited layer (a) comprises a metal oxide, having a thickness of 10 to 500 nm, and having an average value of an elemental ratio of oxygen to the metal of 1.20 to 1.45, and a difference between a maximum value and a minimum value of the elemental ratio is 0.35 or less based on analysis of the vapor-deposited layer in a depth direction thereof by an X-ray photoelectron spectroscopy method.

2. The vapor-deposited barrier film according to claim 1, wherein the metal is silicon.

3. The vapor-deposited barrier film according to claim 1, wherein the vapor-deposited layer (a) is formed by a physical vapor deposition method.

4. The vapor-deposited barrier film according to claim 1, comprising a multilayer vapor-deposited layer that comprises the vapor-deposited layer (a).

5. The vapor-deposited barrier film according to claim 4, wherein the multilayer vapor-deposited layer comprises a vapor-deposited layer that is formed by a physical vapor deposition method and a vapor-deposited layer that is formed by a chemical vapor deposition method.

6. The vapor-deposited barrier film according to claim 5, wherein the vapor-deposited layer that is formed by a physical vapor deposition method is vapor-deposited layer (a).

7. The vapor-deposited barrier film according to claim 1, wherein the difference between a maximum value and a minimum value of the elemental ratio is based on analysis of the vapor-deposited layer (a) in a depth direction thereof by the same X-ray photoelectron spectroscopy method at each of nine positions that divide into 10 portions at regular intervals a width of the vapor-deposited barrier film except for portions of 3% in width from both width ends of the film.

8. The vapor-deposited barrier film according to claim 1, wherein the substrate is a plastic film.

9. The vapor-deposited barrier film according to claim 1, wherein the substrate is a transparent thermoplastic plastic film.

10. The vapor-deposited barrier film according to claim 1, wherein the difference between a maximum value and a minimum value of the elemental ratio is 0.2 or less based on analysis of the vapor-deposited layer in a depth direction thereof by an X-ray photoelectron spectroscopy method.

11. The vapor-deposited barrier film according to claim 1, wherein the difference between a maximum value and a minimum value of the elemental ratio is 0.1 or less based on analysis of the vapor-deposited layer in a depth direction thereof by an X-ray photoelectron spectroscopy method.

12. The vapor-deposited barrier film according to claim 9, wherein the metal is silicon, and the vapor-deposited layer (a) is formed by a physical vapor deposition method.

13. The vapor-deposited barrier film according to claim 12, wherein the average value of the elemental ratio of oxygen to the metal is 1.24-1.45, and the difference between a maximum value and a minimum value of the elemental ratio is 0.32-0.06.

14. The vapor-deposited barrier film according to claim 1, wherein the metal is aluminum, magnesium, zinc, tin, nickel or titanium.

15. A method for producing the vapor-deposited barrier film according to claim 1, the method comprising forming the vapor-deposited layer (a) with a roll-to-roll vapor deposition apparatus comprising a film unwinding and rewinding chamber and a vapor deposition chamber at a ratio of a pressure in the unwinding and rewinding chamber to a pressure in the vapor deposition chamber of 50 or less.

16. The method according to claim 15, wherein the ratio is 5 or less.

17. The method according to claim 15, wherein the pressure in the vapor deposition chamber is $2.5 \times 10^{-2}$ Pa or less.

18. The method according to claim 15, wherein the vapor deposition apparatus further comprises an evacuation chamber between the film unwinding and rewinding chamber and the vapor deposition chamber.

19. The method according to claim 15, wherein oxygen is introduced to the vapor deposition chamber on forming the vapor-deposited layer (a).

\* \* \* \* \*